United States Patent [19]

King et al.

[11] 3,719,566

[45] March 6, 1973

[54] PROCESS FOR MAKING INTEGRATED CIRCUIT PACKAGES

[75] Inventors: Robert E. King; David F. Thompson, both of Warren, Pa.

[73] Assignee: Sylvania Electric Products Inc.

[22] Filed: Jan. 4, 1971

[21] Appl. No.: 103,511

[52] U.S. Cl. ..........................204/15, 29/588, 29/589

[51] Int. Cl. ..............................................C23b 5/48

[58] Field of Search .........29/576 S, 630 B, 576, 588; 204/15; 174/3 FP

[56] References Cited

UNITED STATES PATENTS 3,601,522 8/1971 Lynch..............................174/DIG. 3

*Primary Examiner*—Charles W. Lanham
*Assistant Examiner*—W. Tupman
*Attorney*—Norman J. O'Malley, Donald R. Castle and William McNeill

[57] ABSTRACT

An improvement to a process wherein the electrically conductive parts of an integrated circuit package having a portion of the conductive parts external to a glass-ceramic seal are electroplated with a metal. The improvement comprises fabricating the glass ceramic seal while the electrically conductive portions are in a substantially flat rectangular relationship, then bending two sides of the frame to enable the exposed electrically conductive segments to serve as an electrode, electroplating and removing the two bent sides.

4 Claims, 3 Drawing Figures

INVENTORS
ROBERT E. KING &
DAVID F. THOMPSON
BY
Donald R. Castle
ATTORNEY

PROCESS FOR MAKING INTEGRATED CIRCUIT PACKAGES

BACKGROUND OF THE INVENTION

1. Field Of The Invention

The invention relates to a process for electroplating integrated circuit packages after assembly. More particularly, it relates to an improved method for providing a uniform metal coating to the exposed electrically conductive portions of the package.

2. Prior Art

In the manufacture of integrated circuit packages it is sometimes desirable to deposit a layer of metal over the electrically conductive portions of the package that are external the seal. Particularly when the metal is expensive, such as gold, electroplating affords a method by which thin layers can uniformly be deposited. To achieve uniform and satisfactory electroplating, however, it is necessary that good electrical connection be established so that all portions of the exposed electrically conducting elements serve as an electrode.

The electrically conductive portions of integrated circuit package generally comprise a frame portion, and extending from two sides thereof a plurality of leads that are connected to a central pad portion. All but one of these leads is severed from the central pad portion either before or after fabrication of the hermetic seal. The sequence of severing the leads depends upon the severing method used. The seal, after fabrication, covers the central portion of leads. Therefore, the leads protrude through the outer edge of the seal to two sides of the frame, and through inner edge of the seal toward the pad. Heretofore, after the seal is formed, via heating, the two side portions of the frame that were not connected to leads were severed. To enable the above described exposed segments of the electrically conductive portions to serve as an electrode in a plating bath, electrically conductive wires were used to connect the two remaining sides of the frame.

In addition to being cumbersome and labor consuming, the wires, which were normally applied by hand, sometimes came loose and dropped into the electroplating bath. Loss of the connecting wire resulted in inadequate plating because the electrode no longer functioned.

It is believed, therefore, that a process wherein electrical continuity is maintained thereby enabling the electroplating step to be more efficient is an advancement in the art.

SUMMARY OF THE INVENTION

In accordance with one aspect of this invention there is provided an improvement to the process for electroplating integrated circuit packages after formation of the glass-ceramic seal. The improvement comprises fabricating the glass-ceramic seal while the frame of the electrically conductive portion is in a substantially flat, rectangular form and comprises two opposing lead support sides that have the leads connected thereto and two tying sides of the frame portion that are connected to either end of the lead support sides. Thereafter, bending the two tying sides and the portion of the lead support sides between the support sides and the lead that is adjacent to the tying sides to enable the exposed electrically conductive portions to serve as an electrode, electroplating the exposed segments and, if desired, severing the bent portion from the supporting sides.

DETAILED DESCRIPTION OF THE PREFERRED EMBODIMENTS

For a better understanding of the present invention, together with other and further objects, advantages, and capabilities thereof, reference is made to the following disclosure and appended claims in connection with the above-described drawings.

Figure 1:
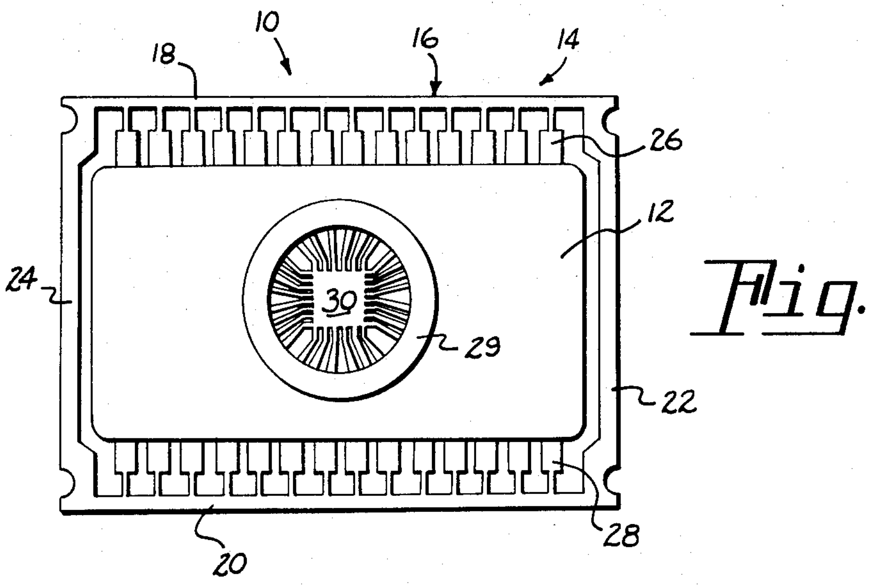
FIG. 1 is a plan view of the package prior to bending the tying sides.

Describing the drawings in more detail, particular reference is made to FIG. 1 in which the package generally designed as 10 is shown. The ceramic seal 12 is formed covering a portion of the electrically conductive portion generally designed as 14. The frame 16 has two opposing lead support sides 18 and 20 and two tying sides 22 and 24. A plurality of leads of which leads 26 and 28 are typical are connected to the support sides 18 and 20 respectively. A metallic washer 29 provides a port for insertion of an IC component such as a semiconductor chip (not shown) onto pad 30. The leads each extend inwardly toward pad 30 and can either be attached to pad 30 as shown or all but one can be severed either prior, during or after the present process is completed.

Figure 2:
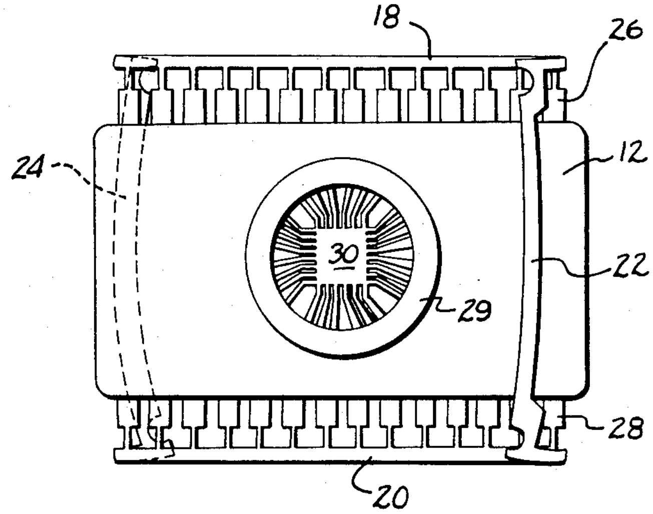
FIG. 2 is a plan view of the package after bending the tying sides.

With particular reference to FIG. 2, the two tying sides 22 and 24 are bent along with a portion of the two support sides 18 and 20. The tying sides 22 and 24 are bent sufficiently to clear the ceramic portion 12. Although the illustration shows the tying sides 22 and 24 bent in opposing directions it is not necessary for the functioning of the process. The tying sides 22 and 24 achieve good electrical connection between all electrically conductive parts of the package.

Figure 3:
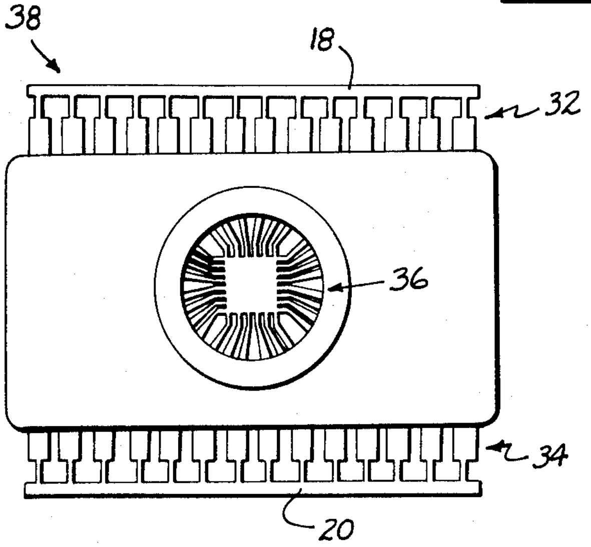
FIG. 3 is a plan view of the package after severing the tying sides.

With particular reference to FIG. 3 after electroplating the electrically conductive elements that would be exposed to the electroplating bath such as the outer portions generally designated as 32 and 34 and the central portion 36, the bent portions are severed from the supporting sides 18 and 20. The supporting sides 18 and 20 provide rigidity and enable the package generally designated as 38 to be shipped.

While there has been shown and described what are at present considered the preferred embodiments of the invention, it will be obvious to those skilled in the art that various changes and modifications may be made therein without departing from the scope of the invention as defined by the appended claims.

What is claimed is:

1. In a process for electroplating the exposed electrically conducting portions of an integrated circuit package having a glass-ceramic hermetic seal over a portion of a plurality of electrically conductive leads that extend through said seal and are connected to two opposing lead support sides of a frame the improvement comprising a. fabricating said glass-ceramic seal while said frame is in a substantially flat, rectangular form and having said two opposing lead support sides having the electrically conductive leads connected thereto and two tying sides of said frame that are at either end of said lead support sides and are each connected to each of said lead support sides, b. bending said two tying sides and portions of said support sides between said tying sides and the lead adjacent to each of said tying sides at least about 180° to enable the resulting bent exposed electrically conducting portions to serve as an electrode, and c. depositing a layer of metal over said electrode by electroplating.

2. A process according to claim 1 wherein said metal is gold.

3. A process according to claim 2 wherein said tying sides are removed after said gold is deposited.

4. A process according to claim 3 wherein said tying sides are bent in opposing directions.

* * * * *